United States Patent [19]

Jahromi

[11] Patent Number: 5,111,324

[45] Date of Patent: May 5, 1992

[54] OPTICAL RECEIVERS

[75] Inventor: Fazlollah R. Jahromi, Essex, England

[73] Assignee: STC PLC, London, England

[21] Appl. No.: 535,744

[22] Filed: Jun. 8, 1990

[30] Foreign Application Priority Data

Jun. 9, 1989 [GB] United Kingdom ................ 8913306

[51] Int. Cl.$^5$ .............................................. H04B 10/06
[52] U.S. Cl. ............................... 359/189; 250/214 A; 330/59
[58] Field of Search ............... 455/619, 617, 606, 607; 330/59; 250/214 A; 359/189, 154

[56] References Cited

U.S. PATENT DOCUMENTS

| | | | |
|---|---|---|---|
| 4,415,803 | 11/1983 | Muoi | 250/214 A |
| 4,473,745 | 9/1984 | Chown | 455/619 |
| 4,498,001 | 2/1985 | Smoot | 455/619 |
| 4,498,197 | 2/1985 | Chown | 455/619 |
| 4,574,249 | 3/1986 | Williams | 330/59 |
| 4,623,786 | 11/1986 | Rodwell | 330/59 |
| 4,688,267 | 8/1987 | Chown et al. | 455/619 |
| 4,759,081 | 7/1988 | Witters | 330/59 |
| 4,805,236 | 2/1989 | Urala | 455/619 |
| 4,853,530 | 8/1989 | Muto | 250/214 A |
| 5,023,951 | 6/1991 | Kahn | 455/619 |

Primary Examiner—Edward L. Coles, Sr.
Assistant Examiner—Kinfe-Michael Negash
Attorney, Agent, or Firm—Lee, Mann, Smith, McWilliams & Sweeney

[57] ABSTRACT

An optical receiver incorporating a voltage dependant impedance arranged to shunt excess AC photodetector signal away from the receiver amplifier in response to light level.

1 Claim, 4 Drawing Sheets

CAPACITANCE C VERSUS REVERSE APPLIED VOLTAGE $V_R$ (TYPICAL VALUES)

OPTICAL RECEIVERS

FIELD OF THE INVENTION

This invention relates to optical receivers used in optical fibre telecommunications systems.

BACKGROUND TO THE INVENTION

The three basic components to any optical fibre communications based system are:
i. a transmitter, which converts an electrical signal to be transmitted into an optical form,
ii. the optical fibre which acts as a waveguide for the transmitted optical signal, and the
iii. optical receiver which first detects the optical signal transmitted and converts it to electrical form.

A typical optical receiver comprises a photodetector, e.g. a reverse biassed avalanche photodiode (APD) or PIN diode, coupled across the inputs of a high impedance amplifier, commonly a transimpedance amplifier. A feedback circuit from the amplifier output is commonly used to provide automatic gain control of the bias applied to the photodetector.

In practice optical receivers have to deal with very large variation of signal strengths. When strong optical signals are detected they usually lead to overloading of the frontend amplifier. The range between the maximum sensitivity and minimum overload point of an optical receiver is called the dynamic range of the receiver.

The present invention seeks to provide a means for increasing the dynamic range of an optical receiver by removing the overload criteria within the operating range without affecting the sensitivity of the receiver.

Examination of the time averaged D.C. photocurrent generated from the received optical signal shows that a linear relationship exists. However, when the optical power received is expressed in dBm relative to the photocurrent generated, an exponential curve is obtained, as shown in FIG. 1.

This curve is fundamental to an understanding of the overload problem since it clearly indicates the kind of current variation the frontend amplifier has to deal with at its input.

Examination of the characteristics of a semiconductor diode shows that the forward bias current variation through the diode with respect to the voltage developed across it is also nonlinear and follows an exponential form, as shown in FIG. 2.

SUMMARY OF THE INVENTION

According to the invention there is provided an optical receiver having a reverse biassed photodetector including a voltage dependant impedance arranged to shunt the photodetector photocurrent in response to increasing voltage drop in the photodetector bias.

BRIEF DESCRIPTION OF THE DRAWINGS

Embodiments of the invention will now be described with reference to the accompanying drawings, in which.

DESCRIPTION OF PREFERRED EMBODIMENTS

Figure 3A:
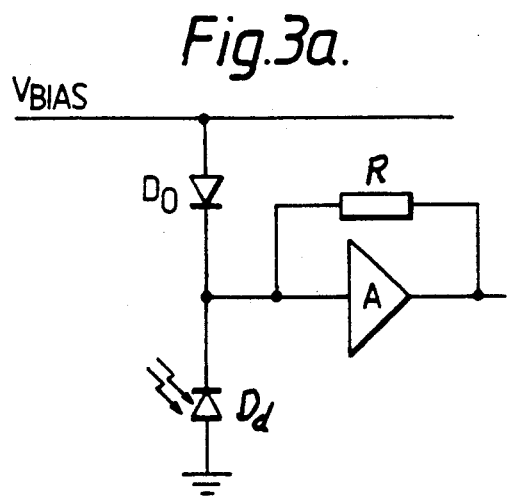
FIGS. 3a and 3b show alternative arrangements for placing a semiconductor diode in series with a semiconductor photodetector in an optical receiver.
Figure 3B:
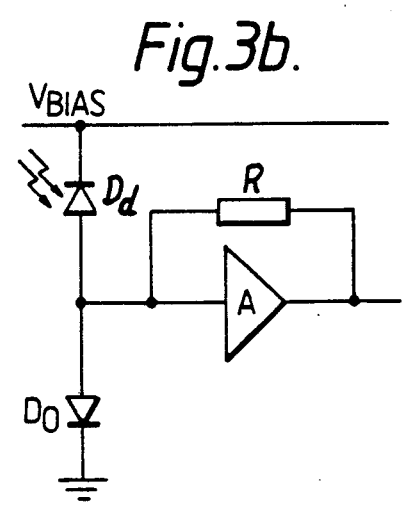

The invention essentially provides a solution to the overload problem since, by placement of a diode $D_o$ in series with the photodiode $D_d$ as shown in FIGS. 3a and 3b, and by applying correct biassing the exponential variation of the photocurrent can be followed.

Figure 4A:
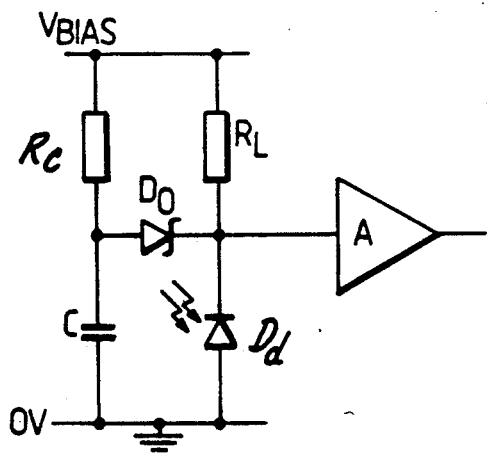
FIGS. 4a and 4b show modifications of the arrangements of FIGS. 3a and 3b with a resistor in parallel with the diode.
Figure 4B:
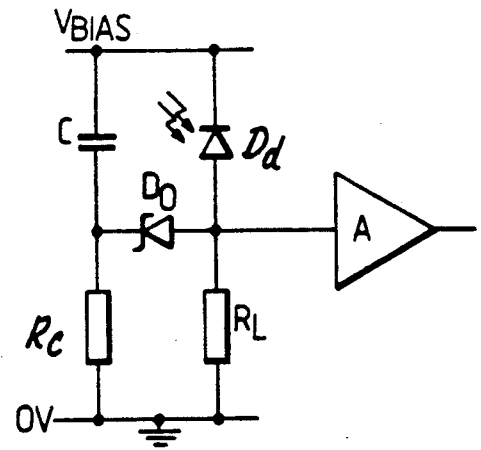

Placement of a resistor $R_1$ in parallel with the diode $D_o$ as in FIG. 4 enables control of the biassing of the diode $D_o$ to be achieved since the photocurrent generated by the photodiode $D_d$ demands a bias current through the resistor $R_1$ and diode $D_o$.

At very low light levels the photocurrent generated is very small, of the order of uAmps. At this stage the bias current is supplied through the resistor $R_1$ but as light level increases the bias current $I_1$ flowing through $R_1$ leads to a voltage drop across it.

Figure 1:
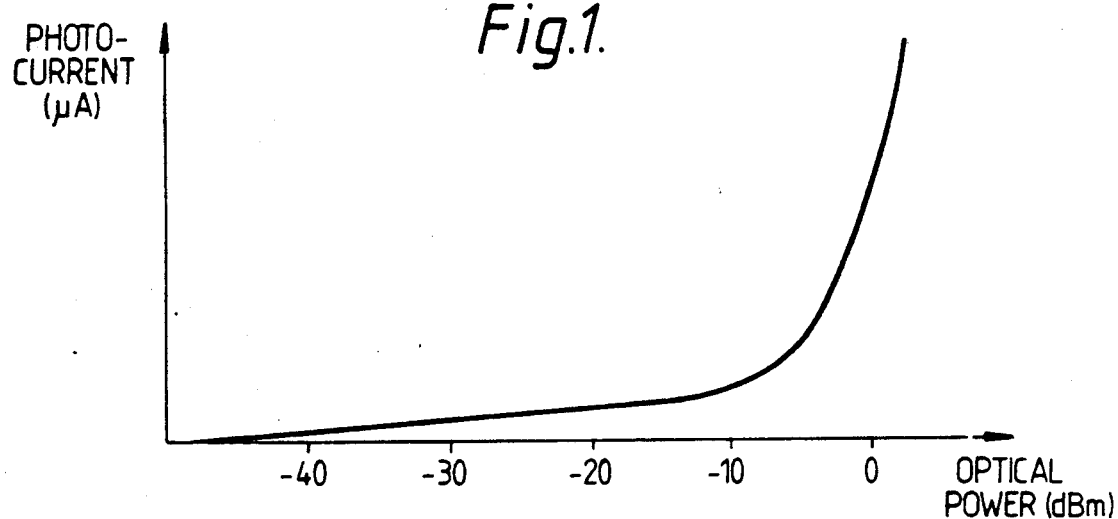
FIG. 1 shows the relationship between photocurrent and optical power in a semiconductor photodetector.
Figure 2:
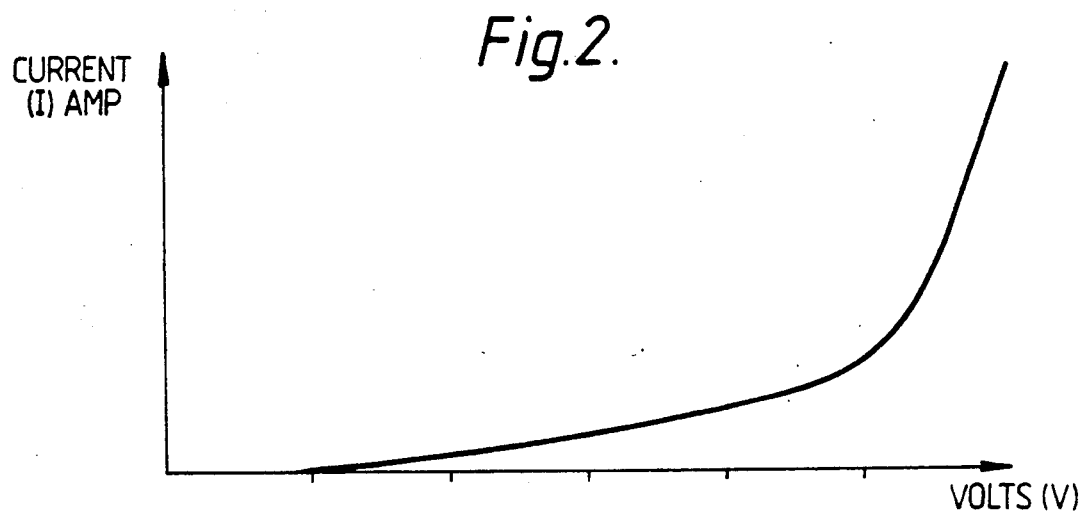
FIG. 2 shows the relationship between forward bias current with respect to voltage across a semiconductor diode.

Looking at FIG. 2 it can be seen that this voltage drop acts as a bias voltage $V_b$ across the diode $D_o$ which then gradually turns the diode on according to the time averaged level of the optical signal.

Another advantage of this resistor is that at sensitivity the majority of the bias current to the photodiode $D_d$ is supplied through the resistor $R_l$. This minimises the noise contribution of the diode $D_o$ and also its junction capacitance $C_t$, which affects the AC component of the signal.

So far only the time averaged DC effect of the optical signal has been considered. However, there is also an AC component which increases with the increased optical signal level and leads to overloading of the frontend amplifier.

Therefore a practical solution should also include means of limiting the maximum AC signal level at the input of the front end amplifier. However, the solution should not affect the AC signal at very low signal levels. From what was said earlier it can be seen that maximum sensitivity is obtained when minimum loading of the photodiode occurs.

So to provide sensitivity as far as the photodiode is concerned, the diode $D_o$ must represent a very high impedance. For AC signals this means that the diode $D_o$ must have a very small device capacitance. This factor becomes more critical to the receiver sensitivity as the frequency of operation is increased.

Figure 5:
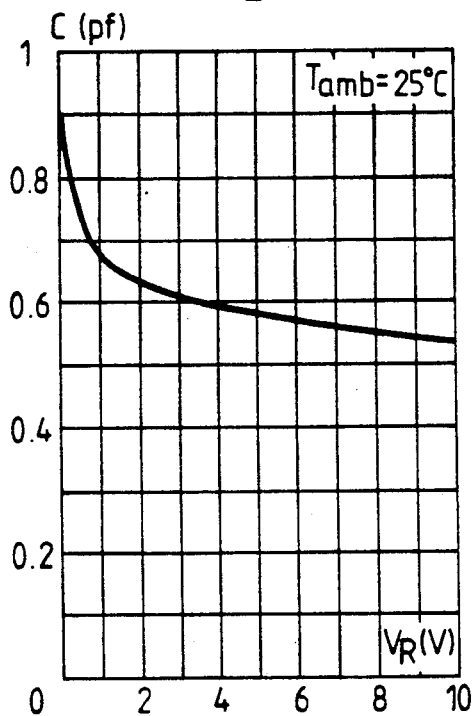
FIG. 5 shows the relationship between junction capacitance and reverse bias voltage of a Schottky semiconductor diode.

Examination of semiconductor diodes reveals that Schottky diodes present very low junction capacitances when reverse biassed or at zero bias, so a Schottky diode can be used. It has been found that with forward biassing of the diode the capacitance of the diode increases exponentially, as shown in FIG. 5. This is exactly what is required since as the photoelectric signal amplitude generated by the diode increases it is required to direct some of the AC signal away from the frontend amplifier. The diode $D_o$ also provides such a path. A grounded capacitor connected to the other end of the diode provides an AC shunting path to the ground such that the impedance presented to the AC signal of the photodiode is only that of the dynamic impedance of the diode $D_o$ at its point of operation.

Figure 6:
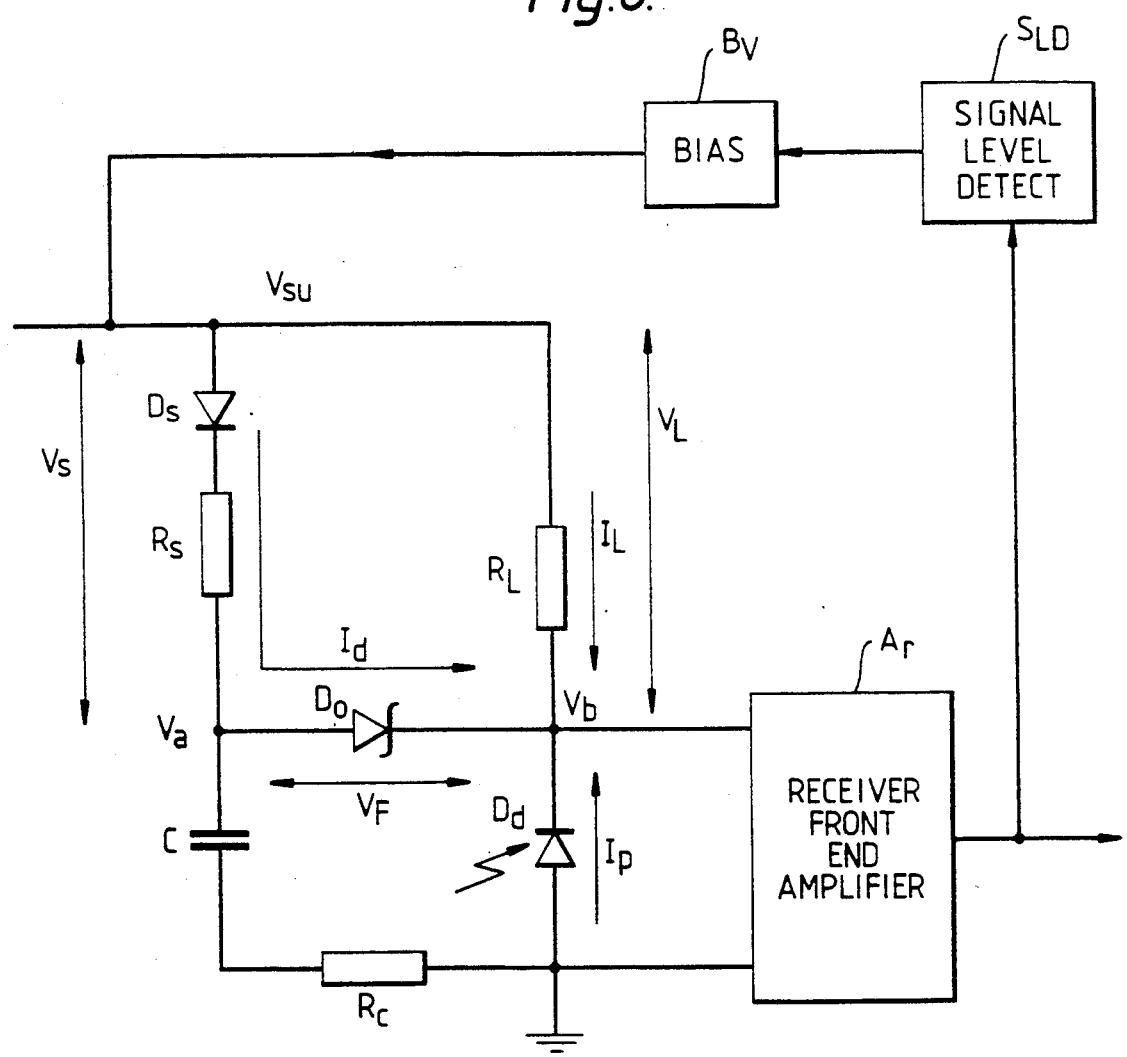
FIG. 6 is a schematic circuit diagram of an optical receiver.

In the diagram of FIG. 6 a photodetector $D_d$ is connected across the inputs to a receiver front end amplifier $A_r$. A feedback circuit from the amplifier includes a signal level detector $S_{ld}$ which provides a gain control signal to a bias voltage circuit $B_v$. Bias voltage Vs is applied to the photodetector via resistor $R_l$. The photodetector $D_d$ is shunted by diode $D_o$ in series with capacitance C and resistance $R_c$. Diode $D_o$ is connected to the bias source through resistance $R_s$ and diode $D_s$.

At low light levels the photocurrent $I_p$ generated by the photodetector $D_d$ is very small, therefore the bias current $I_1$ required to flow through $R_1$ and $D_d$ is also quite small. At this stage most of the bias current is supplied through $R_1$ and there is only a very small current flow through $D_o$, the impedance of $D_o$ being very high. As the optical signal level applied to $D_d$ increases so the photocurrent $I_p$ increases. This leads to a larger current $I_l$ flowing through $R_1$ causing the voltage $V_1$ across $R_1$ to rise. Therefore, as $V_1$ tends towards $V_s$ (the voltage across $D_s$ and $R_s$) plus $V_f$ (the voltage across $D_o$) then diode $D_o$ is gradually turned on. When $V_l = V_s + V_f$ the diode $D_o$ is forward biassed and current $I_d$, through $D_s$ and $R_s$, starts to become the dominant bias current supply for the photodetector $D_d$. At this stage the impedance of $D_o$ is lowered and some of the photocurrent generated by $D_d$ is shunted via capacitance C and resistance $R_c$ to ground, thus limiting the amplitude of the input signal applied to the amplifier $A_r$. The reduction in impedance is due to the non linear behaviour of the diode $D_o$. In general a Schottky device is chosen for the low junction capacitance, low leakage and a suitable variation of dynamic impedance with current. The circuit has an inbuilt feedback control whereby with increasing signal level the bias voltage $V_1$ stays equal to $V_s + V_f$, therefore controlling the bias current flow through $D_o$ and also its impedance to the signal current.

It is to be noted that the circuit of FIG. 6 would still operate is $R_1$ is removed. The sensitivity is reduced slightly but, since the current through $D_o$ is very small it still represents a high impedance to the photodetector current.

There are two main reasons for receiver overload. One reason is the lack of sufficient bias current applied to the photodetector at light optical signal levels. The other reason is that the front end amplifier $A_r$ becomes saturated with a large input signal level. If the second reason is not a limiting criteria the capacitor C can be removed.

The principle of operation of the invention has been explained by way of example using the particular circuit of FIG. 6. However, there are many other arrangements of circuits which would become apparent to those skilled in the art which would achieve the same results. For example, the voltage dependant impedance, exemplified by the diode $D_o$ in FIG. 6, could be implemented instead by a transistor and controlled by a signal from the signal level detector.

Figure 7:
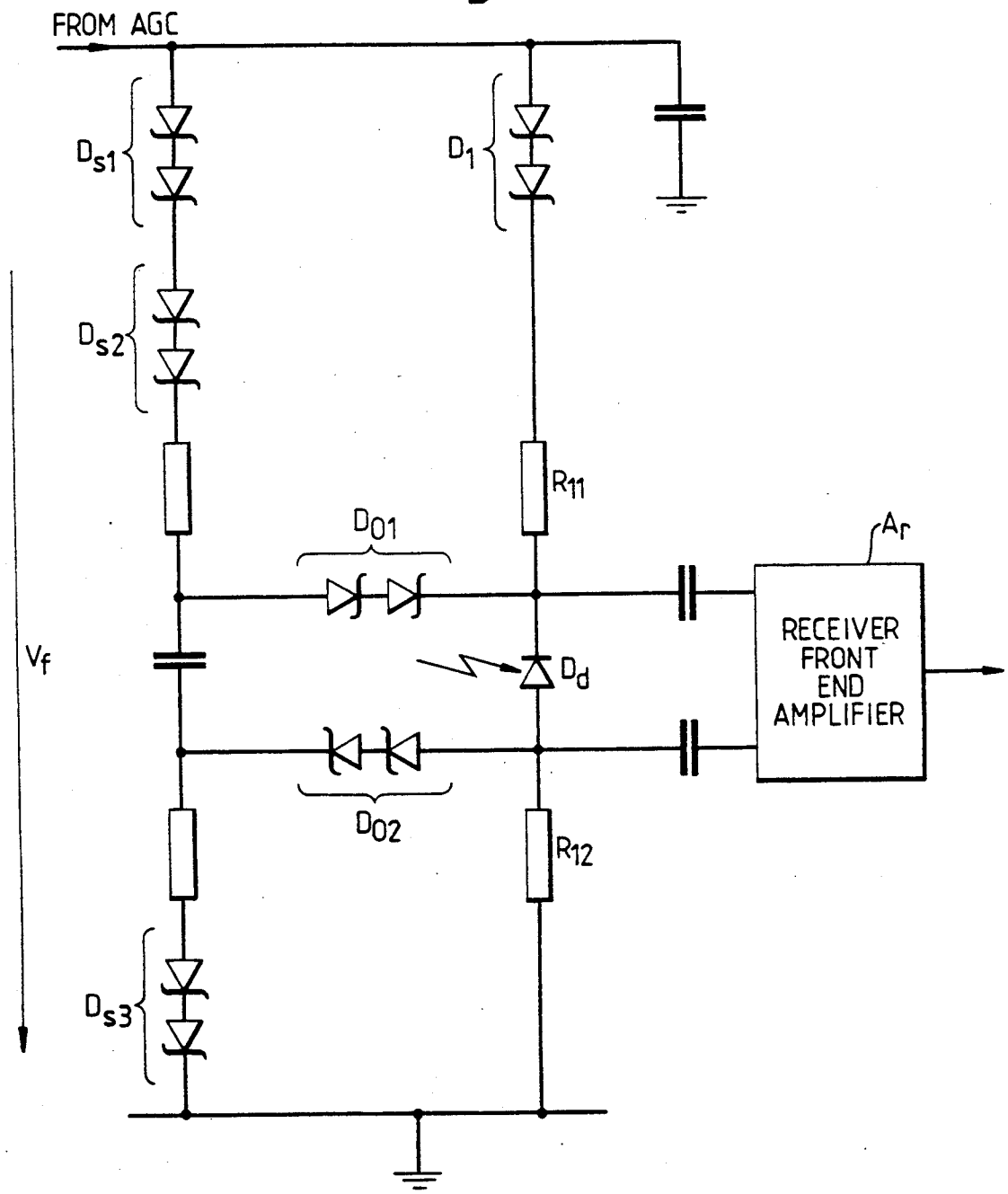
FIG. 7 is a schematic circuit diagram of an alternative optical receiver.

In the alternative circuit shown in FIG. 7, the photodetector $D_d$ is connected in a balanced configuration for amplifier $A_r$, the fixed bias being applied via $R_{11}$ and $R_{12}$. Shunting of the photocurrent is now effected via voltage dependent diodes $D_{01}$ and $D_{02}$ to provide for both polarities of signal current. (Note that in practice series pairs of diodes are used to reduce capacitance effects.). Diode $D_1$ in the fixed bias supply provides dynamic impedance which improves the sensitivity of the photodetector. Diode $D_{s1}$ is included to compensate for changes in $D_1$ due to temperature fluctuation. Diodes $D_{s1}$ and $D_{s2}$ are switching diodes. The forward bias voltage $V_f$ of $D_{s1}$ and $D_{s2}$ controls the point at which the overload diodes switch on.

I claim:

1. An optical receiver having a reverse biassed photodetector, a first diode connected in series with a capacitor and a first resistor to shunt current developed by the photodetector, a second diode connected in series with a second resistor and said first diode, a source of bias current connected to said second diode and via a third resistor to said photodetector, and means for increasing for forward biassing of said first and second diodes respectively dependent in response to increasing optical signal level at said photodetector.

* * * * *